United States Patent
Lin et al.

(10) Patent No.: US 10,998,361 B2
(45) Date of Patent: May 4, 2021

(54) IMAGE-SENSOR PACKAGE AND ASSOCIATED METHOD

(71) Applicant: OmniVision Technologies, Inc., Santa Clara, CA (US)

(72) Inventors: Wei-Feng Lin, Hsinchu (TW); Chun-Sheng Fan, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/139,019

(22) Filed: Sep. 22, 2018

(65) Prior Publication Data

US 2020/0098806 A1 Mar. 26, 2020

(51) Int. Cl.
*H01L 27/146* (2006.01)
*H01L 23/15* (2006.01)

(52) U.S. Cl.
CPC .... *H01L 27/14618* (2013.01); *H01L 27/1469* (2013.01); *H01L 27/14634* (2013.01); *H01L 27/14636* (2013.01)

(58) Field of Classification Search
CPC ............ H01L 27/146; H01L 27/14609; H01L 27/1461; H01L 27/14618; H01L 27/1462; H01L 27/14634; H01L 27/1469; H01L 27/14636; H01L 27/14641; H01L 27/14643; H01L 27/1465; H01L 27/14661; H01L 27/1467; H01L 27/14692; H01L 25/042; H01L 25/0652; H01L 25/0655; H01L 25/0753; H01L 25/165; H01L 25/167; H01L 23/02; H01L 23/053; H01L 23/08; H01L 23/10; H01L 23/31; H01L 23/3107; H01L 23/3121; H01L 23/3128; H01L 23/3135; H01L 23/3142; H01L 23/315; H01L 27/14687; H01L 27/14625;
(Continued)

(56) References Cited

U.S. PATENT DOCUMENTS

| 7,863,702 B2 | 1/2011 | Seo et al. |
| 8,164,191 B2 * | 4/2012 | Nakamura ........ H01L 27/14618 |
| | | 257/431 |

(Continued)

FOREIGN PATENT DOCUMENTS

| CN | 106876356 A | 6/2017 |
| CN | 206558495 U | 10/2017 |
| CN | 107331625 A | 11/2017 |

OTHER PUBLICATIONS

Taiwan Patent Application No. 108133260, Office Action dated Mar. 5, 2020, with English translation 4 pages.

*Primary Examiner* — Natalia A Gondarenko
(74) *Attorney, Agent, or Firm* — Lathrop GPM LLP

(57) ABSTRACT

An image-sensor package includes a cover glass, an image sensor, and an integrated circuit. The cover glass has a cover-glass bottom surface, to which the image sensor is bonded. The integrated circuit is beneath the cover-glass bottom surface, adjacent to the image sensor, and electronically connected to the image sensor. A method for packaging an image sensor includes attaching an image sensor to a cover-glass bottom surface of a cover glass, a light-sensing region of the image sensor facing the cover-glass bottom surface. The method also includes attaching an integrated circuit to the cover-glass bottom surface, a top IC-surface of the integrated circuit facing the cover-glass bottom surface.

14 Claims, 4 Drawing Sheets

(58) Field of Classification Search
CPC ..... H01L 23/04; H01L 23/041; H01L 23/481; H01L 23/5384; H01L 23/564; H01L 2224/18; H01L 2224/20; H01L 2224/2101; H01L 2224/2105; H01L 2224/211; H01L 2224/214; H01L 2224/215; H01L 2224/2205; H01L 2224/224; H01L 2224/2401; H01L 2224/24101; H01L 2224/24146; H01L 2224/24153; H01L 2224/24247; H01L 2224/2499; H01L 2224/2511; H01L 2224/24111; H01L 2224/25113; H01L 2224/29009; H01L 2224/2901; H01L 2224/29011; H01L 2224/29016; H01L 2224/29017; H01L 2224/3003; H01L 2224/30051; H01L 2224/301; H01L 2224/8034; H01L 2225/06548; H01L 2225/06541; H01L 2224/8036; H01L 2224/80395; H01L 2224/80488
USPC ....... 257/434, 432, 433, 678, 778, 737, 704, 257/698, 417, 692, E23.009, E21.5, 257/E21.599; 438/118, 113
See application file for complete search history.

(56) References Cited

U.S. PATENT DOCUMENTS

| | | | | |
|---|---|---|---|---|
| 8,981,511 | B2* | 3/2015 | Kinsman | H01L 27/14618 257/291 |
| 10,672,724 | B2* | 6/2020 | Yamamoto | H01L 23/564 |
| 2006/0113537 | A1* | 6/2006 | Krulevitch | B81C 1/0023 257/57 |
| 2007/0029654 | A1* | 2/2007 | Sunohara | B81C 1/00301 257/678 |
| 2012/0273908 | A1 | 11/2012 | Kinsman et al. | |
| 2013/0050228 | A1* | 2/2013 | Petersen | B81C 1/0023 345/501 |
| 2015/0021081 | A1* | 1/2015 | Mitarai | H01L 23/49833 174/260 |

* cited by examiner

IMAGE-SENSOR PACKAGE AND ASSOCIATED METHOD

BACKGROUND

Camera modules in consumer devices such as stand-alone digital cameras, mobile devices, automotive components, and medical devices often include a complementary metal-oxide-semiconductor (CMOS) image sensor. To efficiently increase device functionality without increasing size, the image sensor is often integrated, or packaged, with other integrated circuits as a system-in-package. The integrated circuits are, for example, microprocessors and/or memory used to process and store images captured by the image sensor.

SUMMARY OF THE EMBODIMENTS

In a first aspect, an image-sensor package includes a cover glass, an image sensor, and an integrated circuit. The cover glass has a cover-glass bottom surface, to which the image sensor is bonded. The integrated circuit is beneath the cover-glass bottom surface, adjacent to the image sensor, and electronically connected to the image sensor.

In a second aspect, a method for packaging an image sensor includes attaching an image sensor to a cover-glass bottom surface of a cover glass, a light-sensing region of the image sensor facing the cover-glass bottom surface. The method also includes attaching an integrated circuit to the cover-glass bottom surface, a top IC-surface of the integrated circuit facing the cover-glass bottom surface.

DETAILED DESCRIPTION OF THE EMBODIMENTS

Figure 1:
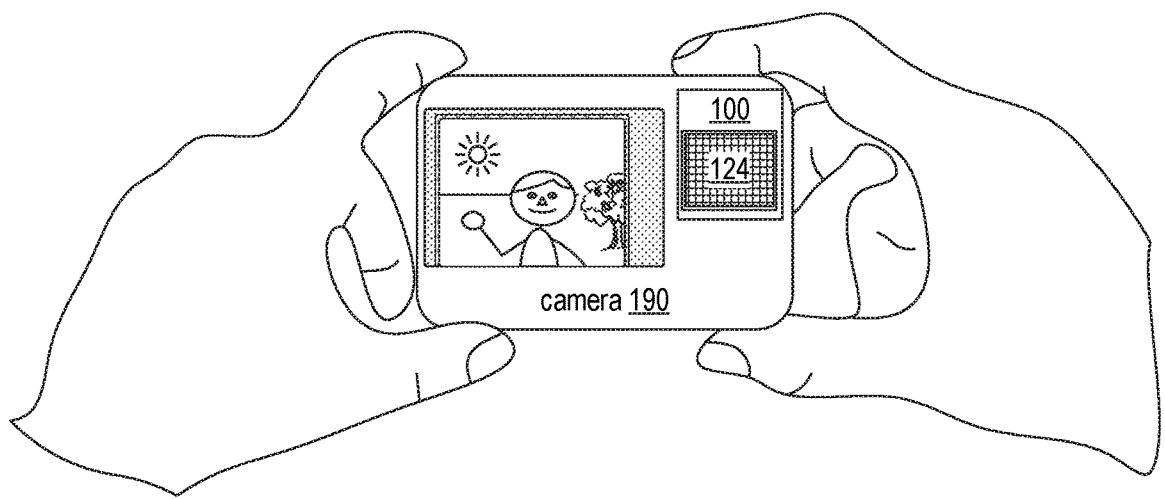
FIG. 1 depicts a camera that includes an embodiment of an image-sensor package.

FIG. 1 depicts a camera 190 imaging a scene. Camera 190 includes an image-sensor package 100.

Figure 2:
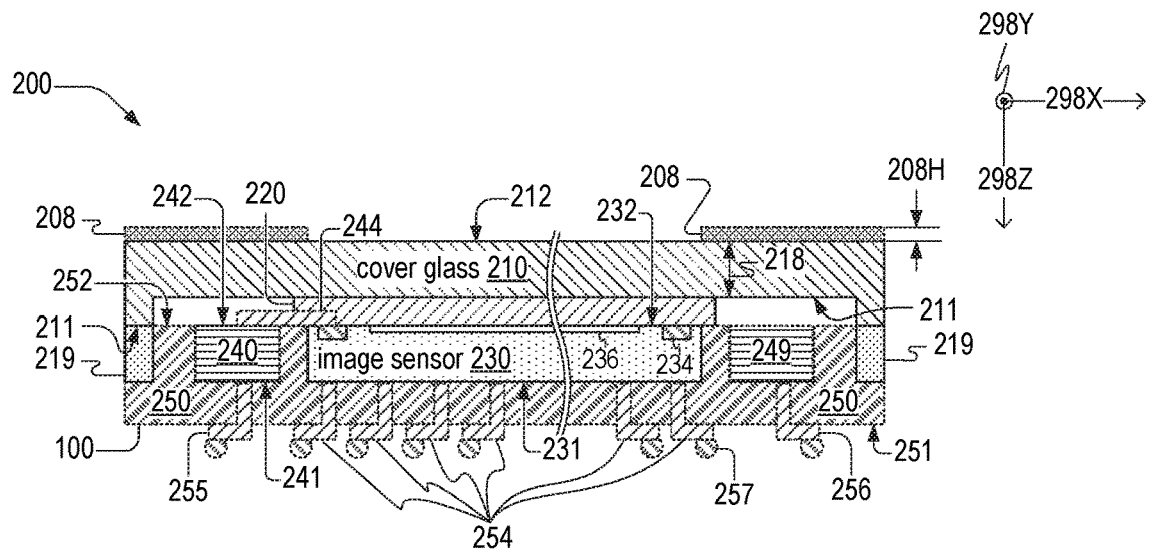
FIG. 2 is a cross-sectional view of an image-sensor package, which is an embodiment of the image-sensor package of FIG. 1.

FIG. 2 is a cross-sectional view of an image-sensor package 200, which is an embodiment of image-sensor package 100. The cross-sectional plane of schematic of FIG. 2 is parallel to a plane formed by orthogonal directions 298X and 298Z, which are each orthogonal to a direction 298Y. Image-sensor package 200 includes a cover glass 210, an image sensor 230, and an integrated circuit 240. Image sensor 230 has a bottom surface 231, top surface 232, and may include a plurality of bond pads 234, which may be exposed on top surface 232. Top surface 232 may include surfaces of bond pads 234. Image sensor 230 also includes a light-sensing region 236 facing a bottom surface 211. Light-sensing region 236 may be part of top surface 232 and may include a pixel array. Integrated circuit 240 includes a bottom IC-surface 241, a top IC-surface 242, and may include at least one of an image signal processor and semiconductor memory, such as DRAM.

Cover glass 210 includes bottom surface 211, to which image sensor 230 is bonded via an adhesive layer 220. Adhesive layer 220 is, for example, a ultra-violet curable adhesive. Integrated circuit 240 is beneath bottom surface 211, adjacent to the image sensor 230, and may be electronically connected to image sensor 230. Adhesive layer 220 may extend between integrated circuit 240 and cover glass 210 such that adhesive layer 220 bonds integrated circuit 240 to bottom surface 211. Above adhesive layer 220, cover glass 210 has a thickness 218, which is between 0.20 millimeters and 0.50 millimeters, for example. Cover glass 210 includes at least one material selected from the group of materials including, but not limited to, aluminosilicate glass, alkali-free glass, borosilicate glass, quartz glass, and combinations thereof. Cover glass 210 includes the top surface 212, which may be partially covered by an opaque mask 208 for preventing stray light from reaching image sensor 230. Opaque mask 208 may include at least one material selected from the group of materials including, but not limited to, photoresist, tungsten, molybdenum, an acrylic monomer, an epoxy monomer, titanium nitride, carbon, an opaque dye, an opaque pigment, and combinations thereof. The opaque dye and opaque pigment may a black dye and a black pigment, respectively. Opaque mask 208 has a thickness 208H, which may be at most three micrometers, for example, between one micrometer and three micrometers.

Image-sensor package 200 may include one or more additional integrated circuits 249, each of which is an example of integrated circuit 240. Image sensor 230 and an integrated circuit 240 may be integrated on the same substrate or may have respective distinct substrates such that, for example, image sensor 230 and integrated circuit 240 are independently bondable to cover glass 210.

Integrated circuit 240 may be electrically connected to image sensor 230 via one or more of the plurality of bond pads 234. Image-sensor package 200 includes, for example, a conductive element 244 that electrically connects integrated circuit 240 to image sensor 230. Conductive element 244 may be part of a redistribution layer (RDL). A first part of the RDL may be between cover glass 210 and integrated circuit 240, while a second part of the RDL may be between cover glass 210 and image sensor 230, as illustrated in FIG. 2 by conductive element 244.

Image-sensor package 200 may also include an isolation layer 250. Each of image sensor 230 and integrated circuit 240 may be between cover glass 210 and isolation layer 250. Isolation layer 250 may include at least one material selected from the group of materials including, but not limited to, an oxide, a solder mask material, silicon carbide, silicon dioxide, silicon nitride, aluminum oxide, benzocyclobutene (BCB), a dielectric, a polyimide, a resin, and combinations thereof.

Isolation layer 250 has a bottom surface 251 and a top surface 252. FIG. 2 illustrates a material-volume 219, which may be part of cover glass 210 such that cover glass 210 extends between bottom surface 251 and top surface 252. Alternatively, material-volume 219 may be part of isolation layer 250. Isolation layer 250 may have a thickness, between surfaces 251 and 252, in the range of 0.70 micrometers and one micrometer.

Isolation layer 250 includes a plurality of conductive vias 254 and a plurality of conductive vias 255. Each conductive via 254 and 255 extends through isolation layer 250 and are electrically connected to image sensor 230 and integrated circuit 240, respectively. When image-sensor package 200 includes additional integrated circuit 249, it may also include a conductive via 256 attached thereto. Any of conductive vias 254-256 may have a solder ball 257 mechanically and/or electrically connected thereto.

Figure 3:
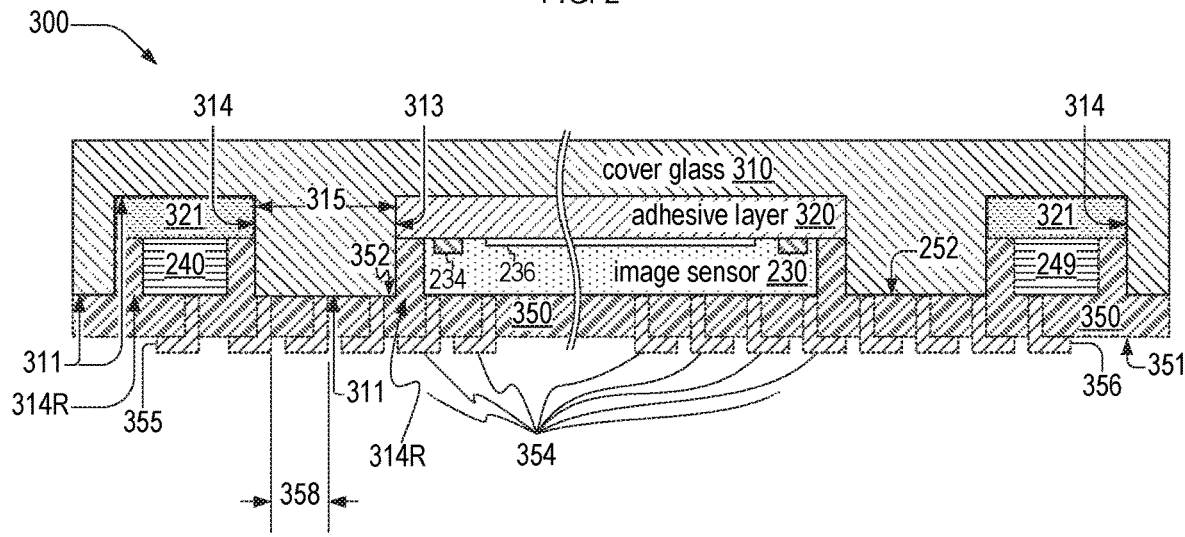
FIG. 3 and FIG. 4 are cross-sectional views of respective image-sensor packages, each of which are examples of the image-sensor package of FIG. 2.

FIG. 3 is a cross-sectional view of an image-sensor package 300, which is an embodiment of image-sensor package 100. Image-sensor package 300 includes a cover glass 310, image sensor 230, and integrated circuit 240. Cover glass 310 is an example of cover glass 210. Image-sensor package 300 may include one or more additional integrated circuits 249. Image-sensor package 300 may include an isolation layer 350, which is an example of isolation layer 250.

Cover glass 310 has a cover-glass bottom surface 311, to which image sensor 230 is bonded via an adhesive layer 320, which is an example of adhesive layer 220. Integrated circuit 240 is beneath cover-glass bottom surface 311, adjacent to the image sensor 230, and may be electronically connected to image sensor 230. Integrated circuit 240 may be electrically connected to image sensor 230 via one or more of the plurality of bond pads 234.

Cover-glass bottom surface 311 is nonplanar such that cover glass 310 includes interior-surfaces 313 and 314. Cover-glass bottom surface 311 and interior-surface 313 form a first recess 313R. Cover-glass bottom surface 311 and interior-surface 314 form a second recess 314R. First recess 313R and second recess 314R at least partially contain image sensor 230 and integrated circuit 240, respectively. Each of first recess 313R and second recess 314R may be blind holes within cover-glass bottom surface 311.

Image-sensor package 300 may also include an isolation layer 350 and conductive vias 354, 355, and 356, which are examples of isolation layer 250 and conductive vias 254, 255, and 256, respectively. Each of image sensor 230 and integrated circuit 240 may be between cover glass 310 and a region of isolation layer 350. Isolation layer 350 includes a bottom surface 351 and a top surface 352. Top surface 352 may be bonded to cover-glass bottom surface 311 at regions of cover glass 310 between recesses 313R and 314R. Within recess 314R, integrated circuit may be bonded to cover glass 310, e.g., by an adhesive layer 321, which may be similar to adhesive layer 320. Integrated circuit 240 may be electrically connected to image sensor 230 by one or more of conductive vias 354-356, a redistribution layer on surface 351, a redistribution layer within isolation layer 350, and combinations thereof.

Recesses 313R and 314R are separated by a minimum distance 315. Adjacent conductive vias 255 are separated by a distance 358. Minimum distance 315 may exceed distance 358 such that bottom surface 351 can accommodate more conductive vias 254 and 255.

Figure 4:
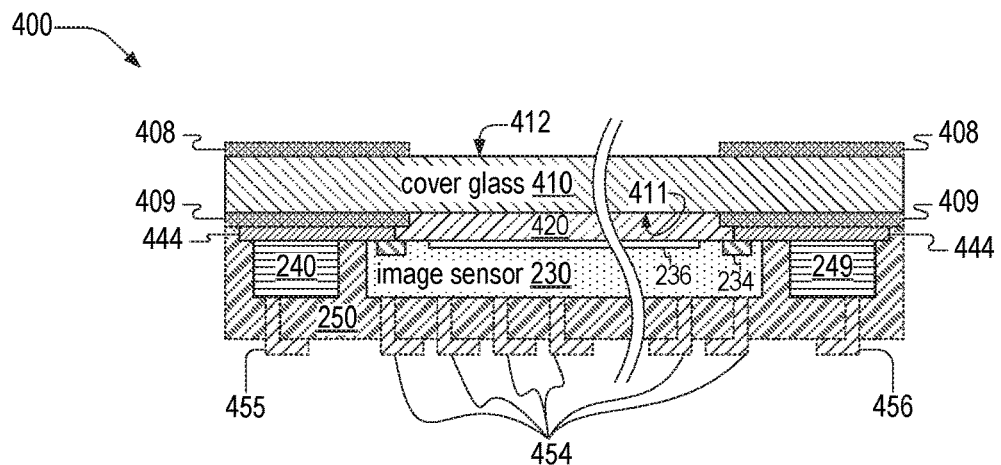

FIG. 4 is a cross-sectional view of an image-sensor package 400, which is an example of image-sensor package 200. Image-sensor package 400 includes a cover glass 410, image sensor 230, and integrated circuit 240. Cover glass 410 is an example of cover glass 210, and has a bottom surface 411 and a top surface 412, each of which may be planar. Image sensor 230 may be bonded to bottom surface 411 via an adhesive layer 420, which is similar to adhesive layer 220.

Image-sensor package 400 may include one or more additional integrated circuits 249. Image-sensor package 400 may also include an isolation layer 450 and conductive vias 454-456, where are examples of isolation layer 250 and conductive vias 254-256, respectively. Image-sensor package 400 includes conductive element 444, which is an example of conductive element 244.

Top surface 412 may be partially covered by an opaque mask 408, which is similar to opaque mask 208. Bottom surface 411 may be partially covered by an opaque mask 409, which is also similar to opaque mask 208. Integrated circuit 240 may be bonded to at least one of opaque mask 409 and conductive element 444, by adhesive layer 420 for example.

Figure 5:
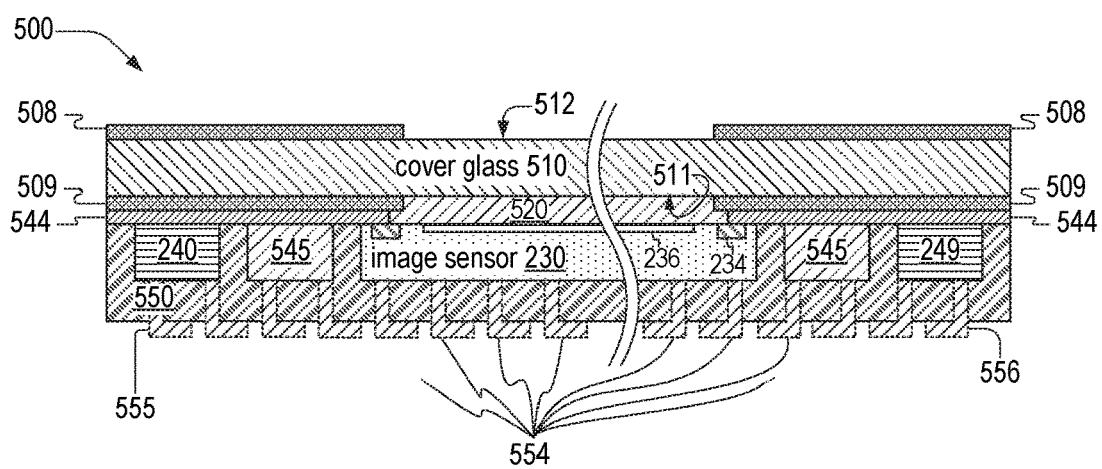
FIG. 5 is a cross-sectional view of an image-sensor package, which is an example of the image-sensor package of FIG. 4.

FIG. 5 is a cross-sectional view of an image-sensor package 500, which is an example of image-sensor package 400. Image-sensor package 500 includes a cover glass 510, image sensor 230, and integrated circuit 240. Cover glass 510 is an example of cover glass 410, and has a cover-glass bottom surface 511 and a cover-glass top surface 512, each of which may be planar. Image sensor 230 may be bonded to cover-glass bottom surface 511 via an adhesive layer 520, which is similar to adhesive layer 220. Cover-glass top surface 512 may be partially covered by an opaque mask 508, which is similar to opaque mask 408. Cover-glass bottom surface 511 may be partially covered by an opaque mask 509, which is also similar to opaque mask 408.

Image-sensor package 500 may include one or more additional integrated circuits 249, and may include an isolation layer 550. Image-sensor package 500 may also include an isolation layer 550 and conductive vias 554-556, where are examples of isolation layer 250 and conductive vias 254-256, respectively. Image-sensor package 500 may include conductive element 544, which is an example of conductive element 444. Integrated circuit 240 may be bonded to at least one of opaque mask 509 and conductive element 544, by adhesive layer 520 for example.

Image-sensor package 500 includes a fan-out extender 545 between image sensor 230 and integrated circuit 240. Fan-out extender 545 enables isolation layer 550 to accommodate more conductive vias 254 and 255, for example, compared to isolation layer 450. Fan-out extender 545 may include at least one material selected from the group of materials including, but not limited to, dielectrics and insulators such as silicon, a polyimide, candidate materials for isolation layer 550, and a glass, such as candidate materials for cover glass 210

Figure 6:
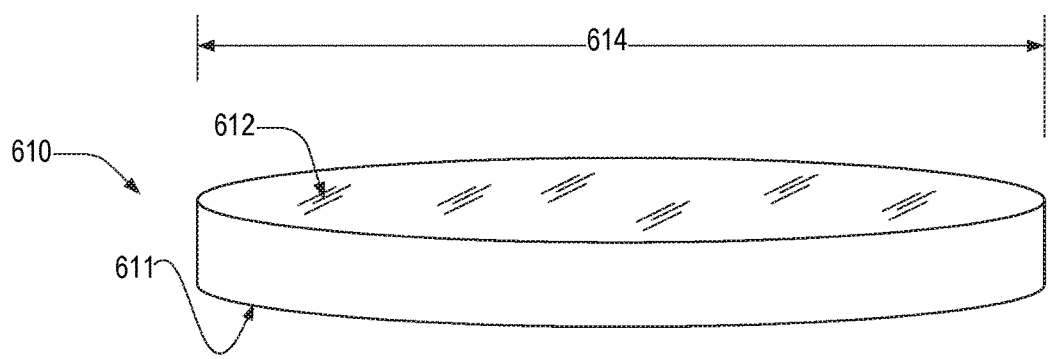
FIG. 6 is a schematic perspective view of a cover-glass wafer, which may be singulated to yield a cover glass of the image-sensor packages of FIGS. 2-5.

FIG. 6 is a schematic perspective view of a cover-glass wafer 610, which may be singulated to yield one of cover glasses 210, 310, 410, and 510. Accordingly, candidate materials for cover-glass wafer 610 includes at least one material selected from the group of materials including, but not limited to, the group of materials associated with cover glass 210. Cover-glass wafer 610 has a bottom surface 611 and a top surface 612, which correspond to respective surfaces 211 and 212 of cover glass 210. Surfaces 611 and 612 may each be planar and parallel to the plane formed by directions 298X and 298Y of FIG. 2, hereinafter the x-y plane. Cover-glass wafer 610 has a diameter 614, which is between one hundred and five hundred millimeters, for example, three hundred millimeters or four-hundred fifty millimeters.

Figure 7:
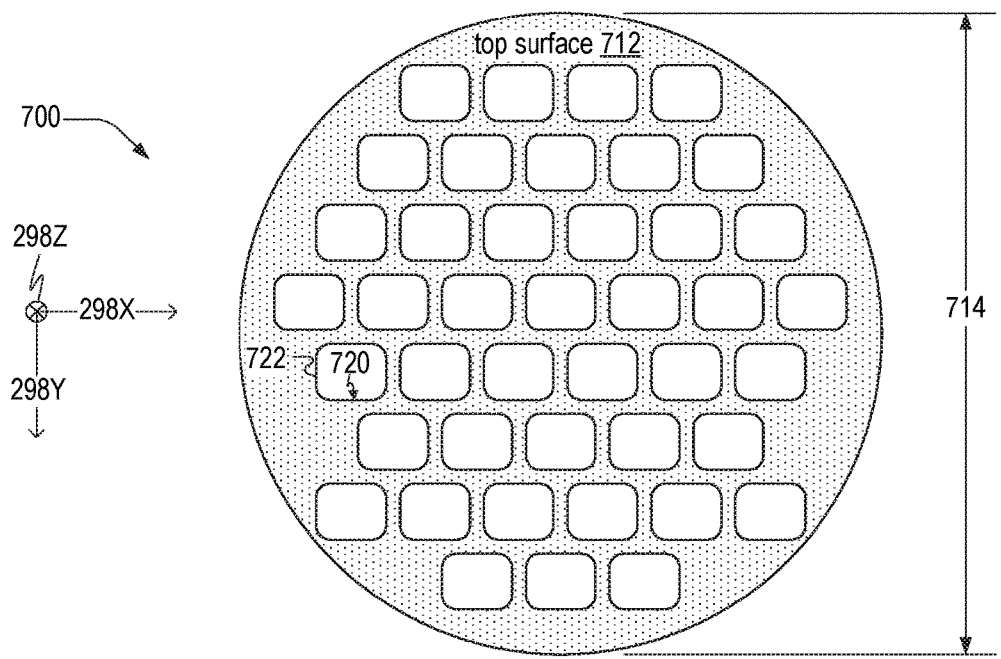
FIG. 7 is a cross-sectional view of an apertured wafer, which may be singulated into fan-out extenders of the image-sensor package of FIG. 5, in an embodiment.

FIG. 7 is a cross-sectional view of an apertured wafer 700 in a plane parallel to the x-y plane. Apertured wafer 700 has a diameter 714, which may equal diameter 614 of cover-glass wafer 610. Cover-glass wafer 610 and apertured wafer 700 may be formed of the same material.

Apertured wafer 700 has a top surface 712 and a bottom surface 711 thereopposite, each of which may be planar and parallel to the x-y plane. While FIG. 9 includes a callout and reference number for bottom surface 711, FIG. 7 does not for clarity of illustration. Between the top surface 712 and bottom surface 711, apertured wafer 700 includes a plurality of interior surfaces 720, which form a respective plurality of apertures 722 through the top surface 712 and bottom surface 711. For clarity of illustration, just one of the interior surfaces 720 and corresponding aperture 722 are labelled in FIG. 7.

Apertured wafer 700 may be singulated to yield a plurality of fan-out extenders 545. As such, fan-out extenders 545 and apertured wafer 700 have the same candidate materials. One fan-out extender 545 corresponds to, for example, apertured wafer 700 between two adjacent apertures 722, where the adjacency may be in either direction 298X or 298Y.

Figure 8:
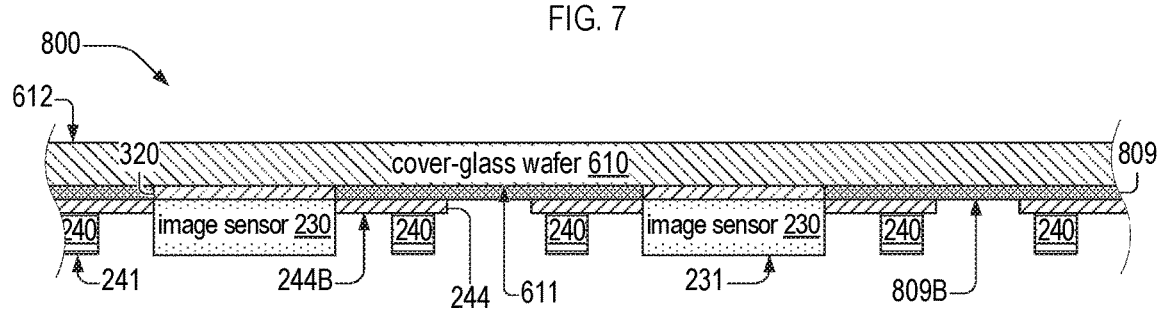
FIG. 8 is a schematic cross-sectional view of a device wafer, which may be singulated to yield an image-sensor package of FIGS. 2-5.

FIG. 8 is a schematic cross-sectional view of a device wafer 800 in a plane perpendicular to surfaces 611 and 612. Device wafer 800 includes a plurality of image sensors 230 and a plurality of integrated circuits 240 attached to bottom surface 611. Between cover-glass wafer 610 and one or more integrated circuits 240, device wafer 800 may include at least one of an opaque layer 809 and at least one conductive element 244. Opaque layer 809 is similar to opaque mask 409, FIG. 4. Conductive element 244 and opaque layer have respective bottom surfaces 244B and 809B. A bottom surface of device wafer 800 may include at least one of bottom surfaces 231, 241, 244B, and 809B.

Figure 9:
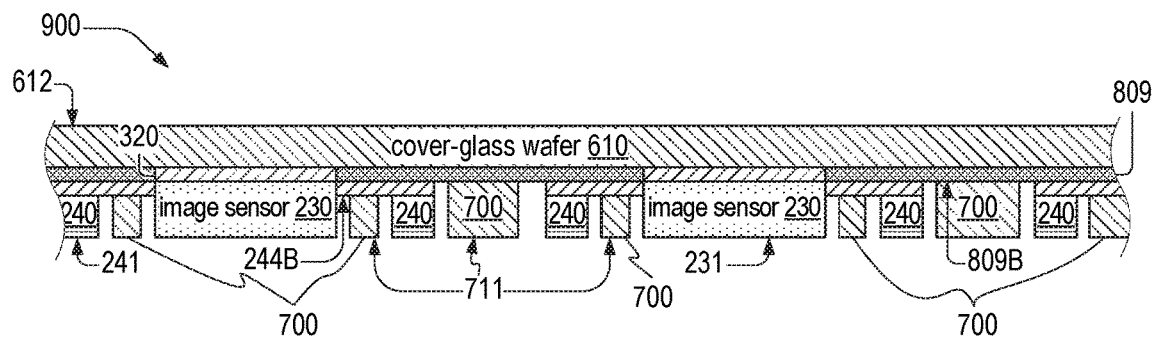
FIG. 9 is a schematic cross-sectional view of a device wafer, which is an embodiment of device wafer of FIG. 8 that includes the apertured wafer of FIG. 7.

FIG. 9 is a schematic cross-sectional view of a device wafer 900, which is an embodiment of device wafer 800 that includes apertured wafer 700. Device wafer 900 may result from attaching apertured wafer 700 to device wafer 800 such that each of the plurality of image sensors 230 is at least partially within a respective aperture 722 of apertured wafer 700. Each of the plurality of integrated circuits may 240 also be at least partially within a respective aperture 722 of apertured wafer 700. A bottom surface of device wafer 900 may include at least one of bottom surfaces 231, 241, 244B, 809B, and bottom surface 711.

Figure 10:
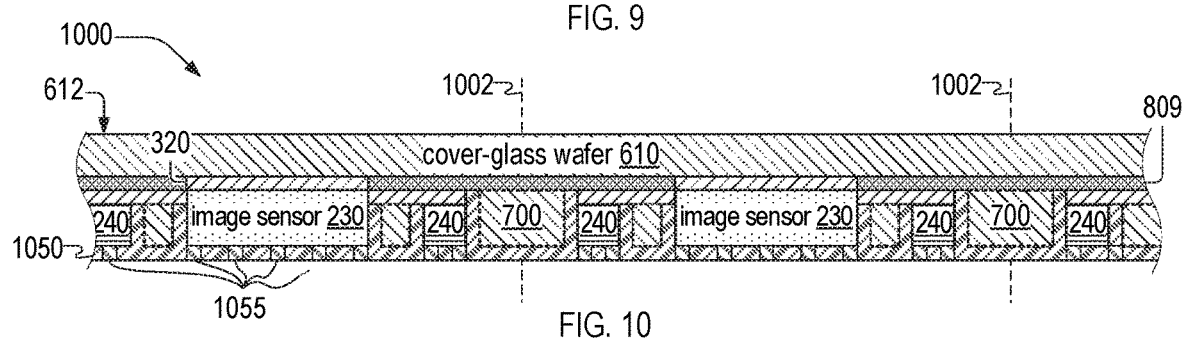
FIG. 10 is a schematic cross-sectional view of a device wafer, which is an embodiment of device wafer of FIG. 8 that includes in isolation layer.

FIG. 10 is a schematic cross-sectional view of a device wafer 1000, which is an embodiment of device wafer 800 that includes an isolation layer 1050. Candidate materials for isolation layer 1050 are the same as those for isolation layer 250. Singulation of device wafer 1000 yields a plurality of packaged image sensors, such as image-sensor packages 200, 300, 400, and 500. Such singulation yields respective isolation layers 250, 350, 250, and 550 of image-sensor packages 200, 300, 400, and 500. Isolation layer 1050 covers exposed bottom surfaces of device wafer 800. Device wafer 1000 may also include apertured wafer 700, as illustrated in FIG. 10, in which case isolation layer 1050 covers exposed bottom surfaces of device wafer 800. Isolation layer 1050 includes a plurality of apertures therethrough, each of which may be filled with a respective conductive via 1055, of which conductive vias 254-256 are examples.

Figure 11:
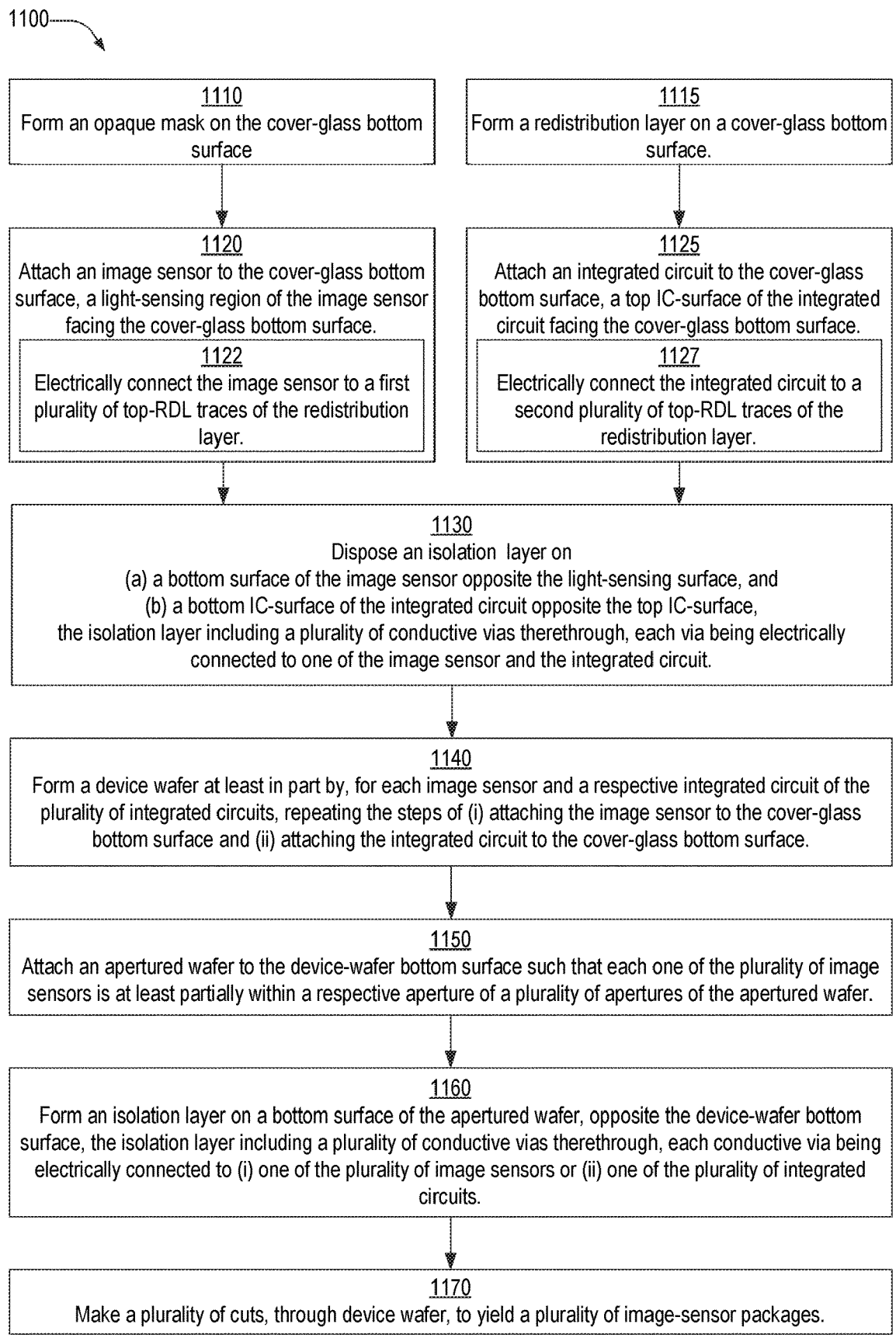
FIG. 11 is a flowchart illustrating a method for packaging an image sensor, in an embodiment.

FIG. 11 is a flowchart illustrating a method 1100 for packaging an image sensor. Method 1100 includes at least one of steps 1110, 1115, 1120, 1125, 1130, 1140, 1150, 1160, and 1170.

Step 1110 includes forming an opaque mask on to a cover-glass bottom surface of a cover glass. Examples of step 1110 include forming opaque mask 409 on cover-glass bottom surface 411, FIG. 4, and forming opaque mask 509 cover-glass bottom surface 511, FIG. 5.

Step 1115 includes forming a redistribution layer on a cover-glass bottom surface. In an example of step 1115, a redistribution layer is formed on one of bottom surfaces 411 and 511, where the redistribution layer includes conductive element 444 and 544, respectively. When method 1100 includes both steps 1110 and 1115, step 1115 may include forming a redistribution layer on an opaque layer previously formed on the cover-glass bottom surface. For example, step 1115 may include forming a redistribution layer on opaque mask 409 or opaque mask 509, where the redistribution layer includes conductive element 444 and 544, respectively.

Step 1120 includes attaching an image sensor to the cover-glass bottom surface, wherein a light-sensing region of the image sensor faces the cover-glass bottom surface. Examples of step 1120 include attaching image sensor 230 to one of cover-glass bottom surfaces 211, 311, 411, and 511 (FIGS. 2-5, respectively) with respective adhesive layers 220, 320, 420, and 520, such that light-sensing region 236 faces the aforementioned cover-glass bottom surfaces.

Step 1120 may include step 1122, which includes electrically connecting the image sensor to a first plurality of top-RDL traces of the redistribution layer. In an example of step 1122, conductive element 244 is part of a redistribution layer, and image sensor 230 is electrically connected to conductive element 244.

Step 1125 includes attaching an integrated circuit to the cover-glass bottom surface, a top IC-surface of the integrated circuit facing the cover-glass bottom surface. Examples of step 1125 include attaching integrated circuit 240 to one of cover-glass bottom surfaces 211 and 311 (FIGS. 2-3) with respective adhesive layers 220 and 321. A third example of step 1125 is attaching integrated circuit 240 to cover-glass bottom surface 411 (FIG. 4), wherein at least one of opaque mask 409 and conductive element 444 is between integrated circuit 240 and bottom surface 411. A fourth example of step 1125 is attaching integrated circuit 240 to cover-glass bottom surface 511 (FIG. 5), wherein at least one of opaque mask 509 and conductive element 544 is between integrated circuit 240 and cover-glass bottom surface 511.

Step 1125 may include step 1127, which includes electrically connecting the integrated circuit to a second plurality of top-RDL traces of the redistribution layer. In an example of step 1127, conductive element 244 is part of the redistribution layer, and integrated circuit 240 is electrically connected to at least one of conductive element 244 and a different conductive element of the redistribution layer.

Step 1130 includes disposing an isolation layer on (a) a bottom surface of the image sensor opposite the light-sensing surface, and (b) a bottom IC-surface of the integrated circuit opposite the top IC-surface. In step 1130, the isolation layer includes a plurality of conductive vias therethrough, wherein each via is electrically connected to one of the image sensor and the integrated circuit. Step 1130 may include forming the isolation layer via spin-coating or chemical vapor deposition. In an example of step 1130, isolation layer 250 is disposed on bottom surfaces 231 and 241 of image sensor 230 and integrated 240, respectively.

Method 1100 may include step 1140 when (a) the cover glass is a cover-glass wafer, such as cover-glass wafer 610, (b) the image sensor is one of a plurality of image sensors, and (c) the integrated circuit is a one of a plurality of integrated circuits. Step 1140 includes forming a device wafer at least in part by, for each image sensor and a respective integrated circuit of the plurality of integrated circuits, repeating the steps of (i) attaching the image sensor to the cover-glass bottom surface and (ii) attaching the integrated circuit to the cover-glass bottom surface. In an example of step 1140, a plurality of image sensors 230 and a plurality of integrated circuits 240 are attached to bottom surface 611 of cover-glass wafer 610 to yield device wafer 800.

Method 1100 may include step 1150 when the device wafer has a device-wafer top surface and a device-wafer bottom surface opposite the device-wafer top surface. The device-wafer top surface corresponds to a top surface of the cover glass opposite the cover-glass bottom surface. The cover glass and the device wafer are, for example, cover-glass wafer 610 and device wafer 800, respectively.

Step 1150 includes attaching an apertured wafer to the device-wafer bottom surface such that each one of the plurality of image sensors is at least partially within a respective aperture of a plurality of apertures of the apertured wafer. In an example of step 1150, apertured wafer 700 is attached to the bottom surface of device wafer 800 to yield device wafer 1000.

Step 1160 includes forming an isolation layer on a bottom surface of the apertured wafer, opposite the device-wafer bottom surface. The isolation layer includes a plurality of conductive vias therethrough, each conductive via being electrically connected to (i) one of the plurality of image sensors or (ii) one of the plurality of integrated circuits. In an example of step 1160, isolation layer 1050 is formed on the bottom surface of apertured wafer 700 to yield device wafer 1000.

Step 1170 includes making a plurality of cuts, through device wafer, to yield a plurality of image-sensor packages. Each of the plurality of cuts may enter the device wafer at the device-wafer bottom surface and exit device wafer at the device-wafer top surface. Compared to the opposite cutting direction, such a cutting direction may yield a flatter device-wafer top surface, which is advantageous for stacking an imaging lens the device-wafer top surface. FIG. 10 includes a plurality of dicing planes 1002 that are perpendicular to top surface 612 and intersect apertured wafer 700. In an example of step 1170, a plurality of cuts through dicing planes 1002 yields one of (i) a plurality of image-sensor packages 200, (ii) a plurality of image-sensor packages 300, (iii) a plurality of image-sensor packages 400, and (iv) a plurality of image-sensor packages 500.

Combinations of Features

Features described above as well as those claimed below may be combined in various ways without departing from the scope hereof. The following examples illustrate some possible, non-limiting combinations:

(A1) denotes an image-sensor package includes a cover glass, an image sensor, and an integrated circuit. The cover glass has a cover-glass bottom surface, to which the image sensor is bonded. The integrated circuit is beneath the cover-glass bottom surface, adjacent to the image sensor, and electronically connected to the image sensor.

(A2) Any image-sensor package denoted by (A1) may include an isolation layer including a plurality of conductive vias therethrough, each conductive via being electrically connected to one of the image sensor and the integrated circuit, each of which are between the cover glass and a region of the isolation layer.

(A3) In any image-sensor package denoted by one of (A1) and (A2), the cover-glass bottom surface may form a first recess at least partially containing the image sensor being at least partially therein, and a second recess at least partially containing the integrated circuit.

(A4) Any image-sensor package denoted by (A3) may include an isolation layer covering a bottom surface of the image sensor and a bottom surface of the integrated circuit opposite the cover glass. The isolation layer includes (i) a plurality of conductive vias therethrough, and (ii) a plurality of solder pads on a bottom side of the isolation layer opposite the cover glass. Each conductive via electrically connects a respective one of the plurality of solder pads to one of the image sensor and the integrated circuit. A first minimum distance, in a first direction, between adjacent solder pads is less than a second minimum distance, in the first direction, between the first recess and the second recess.

(A5) In any image-sensor package denoted by (A4), a region of the cover-glass bottom surface, located between the first recess and the second recess, may be bonded to the isolation layer.

(A6) Any image-sensor package denoted by one of (A1) through (A5) may include a redistribution layer that electrically connects the integrated circuit and the image sensor, at least part of the redistribution layer being between the integrated circuit and the cover glass.

(A7) Any image-sensor package denoted by one of (A1) through (A6) may include an adhesive layer between the cover-glass bottom surface and a light-sensing region of the image sensor.

(A8) In any image-sensor package denoted by one of (A1) through (A7), the image sensor and the integrated circuit may include respective distinct substrates.

(A9) In any image-sensor package denoted by one of (A1) through (A8), the integrated circuit may include one of an image signal processor and semiconductor memory.

(A10) Any image-sensor package denoted by one of (A1) through (A9) may include, in a plane parallel to the cover-glass bottom surface and including the image sensor and the integrated circuit, a spacer between the image sensor and the integrated circuit.

(A11) In any image-sensor package denoted by one of (A1) through (A10), the integrated circuit may be attached to the cover-glass bottom surface.

(B1) denotes a method for packaging an image sensor includes attaching an image sensor to a cover-glass bottom surface of a cover glass, a light-sensing region of the image sensor facing the cover-glass bottom surface. The method also includes attaching an integrated circuit to the cover-glass bottom surface, a top IC-surface of the integrated circuit facing the cover-glass bottom surface.

(B2) Any method denoted by (B1) may include, after the steps of attaching the image sensor and the integrated circuit, disposing an isolation layer on (a) a bottom surface of the image sensor opposite the light-sensing surface, and (b) a bottom IC-surface of the integrated circuit opposite the top IC-surface. The isolation layer includes a plurality of conductive vias therethrough, each via being electrically connected to one of the image sensor and the integrated circuit.

(B3) Any method denoted by one of (B1) and (B2) may include, before the steps of attaching the image sensor and the integrated circuit, forming a redistribution layer on the cover-glass bottom surface wherein: (a) the step of attaching the image sensor includes electrically connecting the image sensor to a first plurality of top-RDL traces of the redistribution layer, and (b) the step of attaching the integrated circuit includes electrically connecting the integrated circuit to a second plurality of top-RDL traces of the redistribution layer.

(B4) Any method denoted by (B3) may include, before forming the redistribution layer, forming an opaque mask on the cover-glass bottom surface, wherein the step of forming the redistribution layer including forming the redistribution layer on the opaque mask.

(B5) Any method denoted by one of (B1) through (B4) may include, when the image sensor is one of a plurality of image sensors and the integrated circuit is a one of a plurality of integrated circuits: forming a device wafer at least in part by, for each image sensor and a respective integrated circuit of the plurality of integrated circuits, repeating the steps of (i) attaching the image sensor to the cover-glass bottom surface and (ii) attaching the integrated circuit to the cover-glass bottom surface.

(B6) Any method denoted by (B5) may include, when the device wafer has a device-wafer top surface, corresponding to a top surface of the cover glass opposite the cover-glass bottom surface, and a device-wafer bottom surface opposite the device-wafer top surface: attaching an apertured wafer to the device-wafer bottom surface such that each one of the plurality of image sensors is at least partially within a respective aperture of a plurality of apertures of the apertured wafer.

(B7) Any method denoted by (B6) may include forming an isolation layer on a bottom surface of the apertured wafer, opposite the device-wafer bottom surface. The isolation layer includes a plurality of conductive vias therethrough, each conductive via being electrically connected to (i) one of the plurality of image sensors or (ii) one of the plurality of integrated circuits.

(B8) Any method denoted by (B7) may include making a plurality of cuts, through device wafer, to yield a plurality of image-sensor packages.

Changes may be made in the above image-sensor package and associated method without departing from the scope hereof. It should thus be noted that the matter contained in the above description or shown in the accompanying drawings should be interpreted as illustrative and not in a limiting sense. Herein, and unless otherwise indicated, the adjective "exemplary" means serving as an example, instance, or illustration. The following claims are intended to cover all generic and specific features described herein, as well as all statements of the scope of the present image-sensor package and associated method, which, as a matter of language, might be said to fall therebetween.

What is claimed is:

1. An image-sensor package comprising:
   a cover glass having a cover-glass bottom surface;
   an image sensor bonded to the cover-glass bottom surface;
   an integrated circuit beneath the cover-glass bottom surface, adjacent to the image sensor, and electronically connected to the image sensor; and
   an isolation layer (i) including a plurality of conductive vias therethrough, each conductive via being electrically connected to one of the image sensor and the integrated circuit, (ii) including a first region between the image sensor and the integrated circuit in a plane parallel to the cover-glass bottom surface and including the image sensor and the integrated circuit, (iii) each of the image sensor and the integrated circuit being between the cover glass and a second region of the isolation layer, and (iv) no part of the isolation layer extending between the cover-glass bottom surface and a light-sensing region of the image sensor.

2. The image-sensor package of claim 1, the cover-glass bottom surface forming a first recess at least partially containing the image sensor, and a second recess at least partially containing the integrated circuit.

3. The image-sensor package of claim 2, further comprising:
   the isolation layer covering a bottom surface of the image sensor and a bottom surface of the integrated circuit opposite the cover glass, and including a plurality of solder pads on a bottom side of the isolation layer opposite the cover glass;
   each conductive via electrically connecting a respective one of the plurality of solder pads to one of the image sensor and the integrated circuit;
   a first minimum distance, in a first direction, between adjacent solder pads being less than a second minimum distance, in the first direction, between the first recess and the second recess.

4. The image-sensor package of claim 3, a cover-glass region of the cover-glass bottom surface, located between the first recess and the second recess, being bonded directly to the isolation layer.

5. The image-sensor package of claim 1, further comprising a redistribution layer that electrically connects the integrated circuit and the image sensor, at least part of the redistribution layer being between the integrated circuit and the cover glass.

6. The image-sensor package of claim 1, further comprising an adhesive layer between the cover-glass bottom surface and the light-sensing region of the image sensor.

7. The image-sensor package of claim 1, the image sensor and the integrated circuit including respective distinct substrates.

8. The image-sensor package of claim 1, the integrated circuit including one of an image signal processor and semiconductor memory.

9. The image-sensor package of claim 1, further comprising, in the plane, a spacer between the image sensor and the integrated circuit, none of the spacer being between the image sensor and the cover glass and none of the spacer being part of the cover glass.

10. The image-sensor package of claim 1, the integrated circuit being attached to the cover-glass bottom surface.

11. The image-sensor package of claim 4, the region of the cover-glass bottom surface being bonded directly to the isolation layer such that no semiconductor material is directly between the region and the isolation layer.

12. The image-sensor package of claim 2, further comprising:
    an adhesive layer between the cover-glass bottom surface and a light-sensing region of the image sensor;
    the isolation layer covering a bottom surface of the image sensor and a bottom surface of the integrated circuit opposite the cover glass, partially filling the first recess and the second recess, and not extending between the cover-glass bottom surface and the light-sensing region of the image sensor.

13. The image-sensor package of claim 12,
    the adhesive layer being in the first recess and including (i) a first adhesive-layer region between the cover-glass bottom surface and a light-sensing region of the image sensor and (ii) a second adhesive-layer region between the isolation layer and the cover glass.

14. The image-sensor package of claim 13, further comprising:
 a second adhesive layer in the second recess and including (i) a third adhesive-layer region between the cover-glass bottom surface and the integrated circuit and (ii) a fourth adhesive-layer region between the isolation layer and the cover glass.

\* \* \* \* \*